(12) United States Patent
Wang et al.

(10) Patent No.: US 12,381,107 B2
(45) Date of Patent: Aug. 5, 2025

(54) PROTECTIVE TAPES, ARTICLES THEREFROM, AND METHODS OF MAKING AND USING SAME

(71) Applicant: 3M INNOVATIVE PROPERTIES COMPANY, St. Paul, MN (US)

(72) Inventors: Shujun J. Wang, Woodbury, MN (US); Robin E. Gorrell, Round Rock, TX (US); Roger A. Grisle, Woodbury, MN (US); Richard Y. Liu, Woodbury, MN (US); Yaoyao Chen, Fremont, CA (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 84 days.

(21) Appl. No.: 18/248,611

(22) PCT Filed: Oct. 19, 2021

(86) PCT No.: PCT/IB2021/059625
§ 371 (c)(1),
(2) Date: Apr. 11, 2023

(87) PCT Pub. No.: WO2022/084855
PCT Pub. Date: Apr. 28, 2022

(65) Prior Publication Data
US 2023/0377937 A1    Nov. 23, 2023

Related U.S. Application Data

(60) Provisional application No. 63/198,444, filed on Oct. 19, 2020.

(51) Int. Cl.
*H01L 21/683* (2006.01)
*C09J 7/40* (2018.01)
*C09J 121/00* (2006.01)

(52) U.S. Cl.
CPC ............ *H01L 21/6836* (2013.01); *C09J 7/40* (2018.01); *C09J 121/00* (2013.01);
(Continued)

(58) Field of Classification Search
CPC ......... H01L 21/6836; H01L 2221/6834; H01L 2221/68386; C09J 7/40; C09J 121/00;
(Continued)

(56) References Cited

U.S. PATENT DOCUMENTS

| 9,741,598 | B2 | 8/2017 | Moriyama et al. |
| 10,312,125 | B2 | 6/2019 | Moriyama et al. |

(Continued)

FOREIGN PATENT DOCUMENTS

| EP | 1379601 B1 | 1/2006 |
| EP | 2060589 A2 | 5/2009 |

(Continued)

OTHER PUBLICATIONS

Machine Translation of JP2004190009A (Year: 2024).*
International Search Report for PCT International Application No. PCT/IB2021/059625, mailed on Jan. 24, 2022, 5 pages.

*Primary Examiner* — Cynthia L Schaller
(74) *Attorney, Agent, or Firm* — Jeffrey M. Olofson

(57) ABSTRACT

An article includes a substrate having a circuit forming surface and a non-circuit forming surface opposite the circuit forming surface. The article further includes a protective tape borne on the circuit forming surface. The protective tape includes a support layer and a curable adhesive layer borne on a major surface of the support layer. The curable adhesive layer includes a rubber elastomer and a thermal curing agent.

18 Claims, 1 Drawing Sheet

(52) U.S. Cl.
CPC .... *C09J 2203/326* (2013.01); *C09J 2301/122* (2020.08); *C09J 2301/312* (2020.08); *C09J 2301/408* (2020.08); *C09J 2301/50* (2020.08); *H01L 2221/6834* (2013.01); *H01L 2221/68386* (2013.01)

(58) Field of Classification Search
CPC ............ C09J 2203/326; C09J 2301/122; C09J 2301/312; C09J 2301/408; C09J 2301/50; C09J 7/29; C09J 109/00; C09J 2301/162; C09J 2421/006; C09J 107/00; C09J 7/38; C08K 5/0025

See application file for complete search history.

(56) References Cited

U.S. PATENT DOCUMENTS

| | | | |
|---|---|---|---|
| 10,340,172 B2 | 7/2019 | Kamada et al. | |
| 2003/0064579 A1* | 4/2003 | Miyakawa | C09J 7/29 438/643 |
| 2009/0314417 A1* | 12/2009 | Sasaki | H01L 21/6836 156/154 |
| 2011/0008597 A1 | 1/2011 | Asai et al. | |
| 2018/0197764 A1 | 7/2018 | Kamada et al. | |
| 2018/0323084 A1 | 11/2018 | Yamagishi et al. | |
| 2019/0055396 A1 | 2/2019 | Sato et al. | |

FOREIGN PATENT DOCUMENTS

| | | | |
|---|---|---|---|
| EP | 1620479 B1 | | 7/2013 |
| JP | 2004190009 A | * | 7/2004 |
| JP | 2007096115 A | | 4/2007 |
| JP | 2018006540 A | | 1/2018 |
| TW | 201546221 | | 12/2015 |
| WO | 2017078036 A1 | | 5/2017 |
| WO | 2017078055 A1 | | 5/2017 |
| WO | 2017078056 A1 | | 5/2017 |
| WO | 2017169958 A1 | | 10/2017 |
| WO | 2020075063 A1 | | 4/2020 |

\* cited by examiner

PROTECTIVE TAPES, ARTICLES THEREFROM, AND METHODS OF MAKING AND USING SAME

CROSS REFERENCE TO RELATED APPLICATIONS

This application is a national stage filing under 35 U.S.C. 371 of PCT/IB2021/059625, filed Oct. 19, 2021, which claims the benefit of U.S. Application No. 63/198,444, filed Oct. 19, 2020, the disclosure of which is incorporated by reference in its/their entirety herein.

FIELD

The present invention generally relates to protective tapes. The protective tapes c may be used, for example, to protect a circuit forming surface of a semiconductor wafer during one or more processes performed on the non-circuit forming surface of the semiconductor wafer.

BACKGROUND

Protective tapes have been described in, for example, U.S. Pat. No. 10,340,172, International Publication WO 2017/169958, Japanese Pub. 2018006540, and U.S. Pat. App. Pub. 2011/0008597.

DETAILED DESCRIPTION

Figure 1:
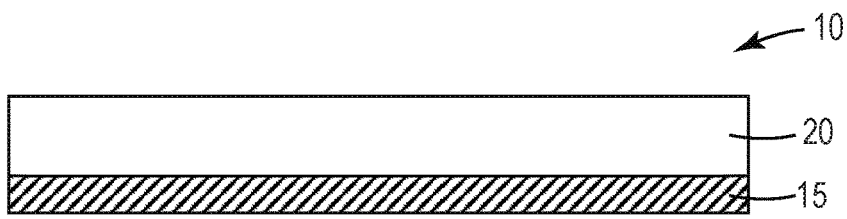
FIG. 1 illustrates a schematic cross section of a protective tape in accordance with some embodiments of the present disclosure.
Figure 2:
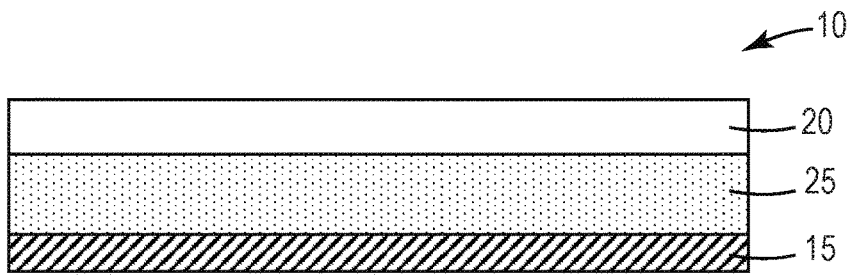
FIG. 2 illustrates a schematic cross section of a semiconductor substrate and a protective tape in accordance with some embodiments of the present disclosure.

In the manufacture of semiconductor devices, adhesive tapes are widely used as an indirect material to facilitate device assembly and handling. The term "indirect material" refers to a material which is disposed of (or discarded) after the application e.g., only temporarily used, Among the most important attributes for semiconductor process tapes are ease of removal and tendency to leave residue on the device surface.

In semiconductor packaging, high processing temperatures are commonly employed in processes such as wire bonding, die attachment, contact metallization, dielectric and adhesive curing, and solder reflow. Although the temperature requirements may vary in each process, the temperature to establish interconnections and a suitable operating environment for these electronic devices (e.g., SiC, GaN or Si) may be 200 degrees Celsius or greater. Such high temperature processing is quite detrimental for adhesives in terms of residuals and the ease of removability.

In order to overcome these issues associated with high temperature processing, many approaches rely on an increase in the crosslinking degree to prevent the adhesive from undergoing degradation as temperatures rise.

The trend in the semiconductor market is that solder balls are evolving into copper pillar bumps, which results in device surfaces becoming increasingly irregular and rough. Copper pillar bumps enable finer pitch making it an excellent interconnect choice for applications such as transceivers, embedded/application processors, power management, baseband, application-specific integrated circuits (ASICs), and systems on a chip (SOCs). This technology allows for smaller devices, reduces the number of substrate package layers, and is ideal for devices that require some combination of fine pitch, environmental compliance, hazardous materials compliance, low cost, and electromigration performance.

The fine pitch or high density of surface irregularities makes it difficult for adhesive to bond on the device surface, especially for the above discussed high temperature resistant and highly crosslinked adhesives. Furthermore, the fabrication processes of semiconductor device, in some cases such as backgrinding or metallization, require the full protection or absorption of solder or copper pillar bumps, which means the adhesive must be fully capable of filling in the fine pitch and wrap around (enclose) the bump without air voids. Furthermore, after high temperature processing with the bump structured surface, it is nearly impossible to easily and cleanly removing the adhesive from the fully encapsulated bumps or surface irregularity with fine pitches or high density.

To achieve both heat resistance, bump absorption and easy/clean removal is very challenging for adhesives. Most semiconductor device makers are using multiple tapes or severe cleaning procedure during various processes to complete tasks.

Similarly, the semiconductor device substrates that include copper pillar bumps or solder balls can also include reconstructed chips embedded in a molding compound, or any other substrates having copper pillar bumps or solder balls which need backside processes or the high temperature processes to further build functional layers on the sides without the bump or ball surface features.

Consequently, a protective tape which can resist degradation at high temperatures (e.g., 260° C. or higher), absorb fine-pitched solder/copper pillar bumps, and peel easily while minimizing or eliminating adhesive residue after removal, is desirable.

As used herein:

The term "room temperature" refers to a temperature of 22° C. to 25° C.

The term "cure" refers to joining polymer chains together by covalent chemical bonds, usually via crosslinking molecules or groups, to form a network polymer. Therefore, in this disclosure the terms "cured" and "crosslinked" may be used interchangeably.

The term "debond force" means the minimum force applied to a pair of adjacent layers in a debondable stack that will result in the smooth debonding of the lamination of such adjacent layers at or near room temperature.

Repeated use of reference characters in the specification is intended to represent the same or analogous features or elements of the disclosure. As used herein, the word "between", as applied to numerical ranges, includes the endpoints of the ranges, unless otherwise specified. The recitation of numerical ranges by endpoints includes all numbers within that range (e.g. 1 to 5 includes 1, 1.5, 2, 2.75, 3, 3.80, 4, and 5) and any range within that range.

In some embodiments, the present disclosure provides a tape useful in, for example, temporarily bonding to and protecting the circuit forming surface of a semiconductor wafer 100. As shown in FIG. 1, in some embodiments, a tape 10 may include a support layer 15, an adhesive layer 20, and an optional intermediate layer 25 this is disposed between the support layer and the adhesive layer 20. It is to be appreciated that both the adhesive layer 20 and intermediate layer 25 are formed by curing of a curable composition. For purposes of the present application, the term "curable" is used to designate that the layer is being described pre-cure, and the term "cured" is used to designate that the layer is being described post-cure and includes the cured reaction product of the curable layer.

In some embodiments, the support layer 15 may include (or be formed of) a polymeric resin, a metal foil, a paper sheet, or the like. Examples of suitable polymeric resins include polyesters such as polyethylene terephthalate (PET) and polyethylene naphthalate (PEN); polyolefin-based resins; polyimides (P1); polyether ether ketones (PEEK); polyvinyl chloride-based resins such as polyvinyl chloride (PVC); polyvinylidene chloride-based resins; polyamide-based resins; polyurethanes; polystyrene-based resins; acrylic resins; fluororesins; cellulosic resins; and polycarbonate-based resins. In some embodiments, the polymeric resins may have a melting point (as well as sustain such temperature without appreciable shrinkage) of at least 200° C., at least 225° C., or at least 250° C. In some embodiments, the polymeric resins may be thermal-resistant resins being pyrolytic without any clear melting point, but having high heat resistance.

In some embodiments, the support layer 15 may have a thickness of 10 to 500 μm. Support layer 15 may be arranged as a single layer or a plurality of layers with each of the layers being the same or different.

In some embodiments, the curable adhesive layer 20 may include a rubber elastomer and a thermal curing agent.

In some embodiments, the rubber elastomers of the curable adhesive layer 20 may include rubber elastomers that include unsaturated double bonds such as isoprene, butadiene or other diene monomers or termonomers, or tertiary carbon bonds. The rubber elastomers may be natural rubber or synthetic thermoplastic elastomer, styrene-butadiene rubber, polybutadiene rubber, polyisoprene rubber, nitile rubber, ethylene-propylene rubber (EPR), ethylene-propylene diene monomer (EPDM), ethylene-vinyl acetate(EVA), acrylonitrile-butadiene-styrene rubber, or other similar rubber elastomers. In some embodiments, the curable adhesive layer 20 may include rubber elastomer in an amount of from 10 to 99 wt. %, from 20 to 90 wt. %, or from 30 to 85 wt. %, based on the total weight of the curable adhesive layer 20.

As used herein, a thermal curing agent for a rubber elastomer refers to a compound that is activated by heat and hardened by a curing reaction with a rubber elastomer. In some embodiments, suitable thermal curing agents may include sulfur containing compounds or derivatives thereof, peroxides, phenolic resins, or aromatic guanidines. In some embodiments, suitable sulfur containing compounds may include thiazoles, often derivatized with sulfenamide groups, such as 2-mercaptobenzothiazole (MBT), thio-carbonyl species such as thiurams, dithiocarbamates, xanthates and organic thioureas. In some embodiments, suitable peroxides may include dialkyl (including aralkyl) peroxides such as dicumyl peroxide, DCP, also peroxyketals, peroxyesters, or diacyl peroxides. In some embodiments, suitable phenonic resins may include methylol or bromo-methyl groups for reactivity. In some embodiments, the curable adhesive layer may include the thermal curing agent in an amount of from 1 to 50 wt. %, from 1 to 30 wt. %, or from 1 to 20 wt. %, based on the total weight of the curable adhesive layer 20.

In some embodiments, the curable adhesive layer may optionally include any or all of a plasticizer, a catalyst to accelerate the rubber curing process, or a tackifier. Suitable plasticizers include a broad range of esters (phthalates, adipates, sebacates) as well as aromatic, naphthenic, and paraffinic oils. Plasticizers, if present, may be present in the curable adhesive layer 20 may in an amount of from 1 to 50 wt. %, from 1 to 30 wt. %, or from 1 to 20 wt. %, based on the total weight of the curable adhesive layer 20. Suitable catalysts include zinc oxide, zinc resinate, magnesium oxide, or other metal oxides. Catalysts, if present, may be present in the curable adhesive layer 20 in an amount of from 1 to 20 wt. %, from 1 to 10 wt. %, or from 1 to 5 wt. %, based on the total weight of the adhesive layer 20. Suitable tackifiers may include hydrocarbon resins, rosin esters, terpene resins, or phenolic resins. Tackifiers, if present, may be present in the curable adhesive layer 20 in an amount of from 1 to 30 wt. %, from 1 to 20 wt. %, or from 1 to 10 wt. %, based on the total weight of the curable adhesive layer 20.

In some embodiments, the curable adhesive layer 20 may also include any or all of fillers, pigments, additives, or antistatic additives.

In some embodiments, the curable adhesive layer 20 may be disposed on the support layer 15 at a thickness of 10 to 500 μm or 10 to 300 μm.

It was discovered that the above-described components of the adhesive layer (which may be described as a thermally curable thermoplastic rubber) may be combined such the adhesive layer 20 exhibits properties that render it particularly suitable for high temperature temporary wafer bonding. For example, in some embodiments, the curable adhesive layer 20 can be cured at temperatures of 110° C. or higher. In some embodiments, at room temperature, the curable adhesive layer 20 may meets the Dahlquist criterion (i.e., functions as a pressure sensitive adhesive in that it has an elastic storage modulus (G') value of less than 0.1 MPa at 25° C. and 1 Hz).

In some embodiment, the elastic storage modulus of the curable adhesive layer decreases as the adhesive system begins heating up (and continues to decrease until a temperature of about 110° C.), thereby enabling the adhesive to flow into any surface features present on the substrate (e.g., bumped wafer surface fine features). Still further, the cured adhesive layer 20 has a storage modulus at 200° C. that is higher than the storage modulus at 70° C., which facilitates no or low residue after removal of the adhesive from a substrate.

In some embodiments, the curable adhesive layer 20 may have an elastic storage modulus (G') of higher than 0.02 MPa in the range of 25° C. to 250° C. (which, in practical terms, means the adhesive is not liquid, but rather is in a film format in the range of 25° C. to 250° C.; the adhesive layer 20 may have a G' of greater than 0.1 MPa at 250° C., and a G' at 250° C. that is greater than its G' at 50° C. (which, in practical terms means that at 250° C., the adhesive is cured and has a G' higher than the non-cured stage at 50° C.; the curable adhesive layer 20 may have a minimum value of G' that occurs between 50° C. to 150° C., and a minimum value of G' that is greater than 0.02 MPa (which, in practical terms, means that the adhesive softens when subjected to temperatures of above 50° C., the minimum value of G' occurs before the curing of the curable adhesive, and after 150° C., the adhesive is cured and G' increases from the minimum.

Finally, the curable adhesive layer 20 may have a tan delta at 250° C. of lower than 0.1, which means the cured adhesive is still soft enough to be able to peel off and not completely solidified.

For purposes of the present disclosure, elastic storage modulus (G') and tank delta values are determined in accordance with the DMA test method of the Examples of the present disclosure.

In some embodiments, the protective tape 10 may optionally include an intermediate layer 25. Generally, the intermediate layer 25 may provide the protective tape 10 with further bump encapsulation capability for extremely high bumps, such as those over 15 μm in height. In order to well encapsulate such high bumps on the semiconductor substrates.

In some embodiments, the curable intermediate layer 25 may include an elastomer, a multifunctional crosslinking agent and, optionally, any or all of a process oil, a tackier or a radiation initiator.

In some embodiments, the elastomer of the curable intermediate layer 25 may include elastomers that can be UV or Electron beam radiation cured. Suitable elastomers include natural rubber or synthetic thermoplastic elastomer, styrene-butadiene rubber, polybutadiene rubber, polyisoprene rubber, nitrile rubber, ethylene-propylene rubber (EPR), ethylene-propylene diene monomer (EPDM), ethylene-vinyl acetate(EVA), acrylonitrile-butadiene-styrene rubber, silicone rubber, polyolefin (co)polymer, thermoplastic polyurethane, acrylic elastomer, or engineered polyamide elastomer. In some embodiments, suitable polyolefin (co)polymers may include both saturated and unsaturated olefin blocks or polymers. These olefin blocks may include oligomeric polyethylene, polypropylene, polyoctene, polyhexene, polybutadiene, polyisoprene, polybutene, and/or polypentene. In some embodiments, the curable intermediate layer 25 may include elastomer in an amount of from 20 to 98 wt. %, from 20 to 80 wt. %, or from 20 to 60 wt. %, based on the total weight of the curable intermediate layer 25.

In some embodiments, the multi-functional crosslinking agent of the curable intermediate layer 25 may be any multi-functional chemical compound that can react with the functionality of the molecular chains in the base polymer of the elastomer and form a three-dimensional polymeric network, and which is triggered by the UV/Ebeam radiation. Suitable multi-functional crosslinking agents may include multifunctional acrylates/methacrylates, multifuctional amines/amides, multifunctional silanes, or multifunctional anhydrides In some embodiments, the curable intermediate layer 25 may include multi-functional crosslinking agents in an amount of from 0.1 to 10 wt. %, from 0.1 to 8 wt. %, or from 0.1 to 5 wt. %, based on the total weight of the curable intermediate layer 25.

In some embodiments, the process oil of the curable intermediate layer 25 may be a plasticizer oil that facilitates coating of the elastomer onto the support layer. Suitable plasticizer oils include a broad range of esters (e.g., phthalates, adipates, sebacates) as well as aromatic, naphthenic, and paraffinic oils. In some embodiments, the curable intermediate layer 25 may include process oil in an amount of from 1 to 50 wt. %, from 1 to 40 wt. %, or from 1 to 30 wt. %, based on the total weight of the curable intermediate layer 25.

In some embodiments, the curable intermediate layer 25 may optionally include any or all of a tackifier, radiation cure initiator, or polyolefin polymer. Suitable tackifiers include hydrocarbon resins, rosin esters, terpene resins, or phenolic resins. Tackifiers, if present, may be present in the curable intermediate layer 25 in an amount of from 1 to 40 wt. %, from 1 to 35 wt. %, or from 1 to 30 wt. %, based on the total weight of the curable intermediate layer 25. Suitable radiation cure initiators include free radical photoinitiators such as 1-hydroxycyclohexylphenyl-ketone, 2-hydroxy-2-methyl-1-phenylpropanone, 2-ethylhexyl-(4-N,N-dimethyl amino)benzoate, and 2-ethyl-(4-N,N-dimethylamino)benzoate. Radiation cure initiators, if present, may be present in the curable intermediate layer 25 in an amount of from 0.1 to 3 wt. %, from 0.1 to 2 wt. %, or from 0.1 to 1 wt. %, based on the total weight of the curable intermediate layer 25. Suitable polyolefin polymers include any high melting temperature polyolefin polymers (e.g., a melting point of more than 120 degrees Celsius), such as polyethylene, polypropylene, random or block copolymers thereof, or high Tg amorphous cyclic olefin copolymers. Polyolefin polymers, if present, may be present in the curable intermediate layer 25 in an amount of from 0.5 to 5 wt. %, from 0.5 to 3 wt. %, or from 0.5 to 2 wt. %, based on the total weight of the curable intermediate layer 25.

In some embodiments, the curable intermediate layer 25 may also include any or all of fillers, pigments, additives, or antistatic additives.

In some embodiments, the cured intermediate layer 25 may have an elastic storage modulus (G') of between 0.0001 MPa and 0.7 MPa in the range of 25° C. to 250° C. The curable intermediate layer may be radiation cured during the tape manufacturing process. After curing, its elastic storage modulus G' may decrease with increasing temperature in the range of 25° C. to 250° C. Its minimum value of G' may occur at 250° C., which is greater than 0.0001 MPa at 250° C. The cured intermediate layer may have a G' at 250° C. that is less than its G' at 50° C.

In some embodiments, the intermediate layer 25 may be disposed on the support layer 15 at a thickness of 10 to 500 μm or 10 to 400 μm.

In some embodiments, the components or layers that make up the protective tape 10 may exhibit properties relative to one another that render the protective tape 10 particularly useful for temporary bonding applications (i.e., the curable adhesive layer (along with any other components of the protective 10) can be easily and cleanly removed from a substrate after curing). In this regard, in some embodiments, the debonding force between the cured adhesive layer 20 and certain substrates (e.g., a semiconductor wafer) is less than 3 N/in and, to the unaided human eye, will leave no or very little adhesive residue. In some embodiments, the debonding force between the support layer 15 and the cured adhesive layer 20 is higher than the debonding force between the cured adhesive layer 20 and certain substrates (e.g., a semiconductor wafer). In some embodiments, the debonding force between support layer 15 and the cured intermediate layer 25, or between the cured intermediate layer 25 and the cured adhesive layer 20, is higher than the debonding force between the cured adhesive layer 20 and certain substrates (e.g., a semiconductor wafer).

The protection tapes of the present disclosure can be produced using any conventional method. For example, the protection tapes can made by laminating adhesive layer 20 and, optionally, intermediate layer 25 to the same surface of support layer 15. Lamination may be performed by using a coating method of, for example, die-coater coating, roll coating, screen coating, or gravure coating. Prior to laminating adhesive layer 20, the intermediate layer may be cured. Curing of the intermediate layer 25 may be carried out by, for example, exposing the curable intermediate layer 25 to radiation (e.g., ultraviolet or e-beam.

Figure 3:
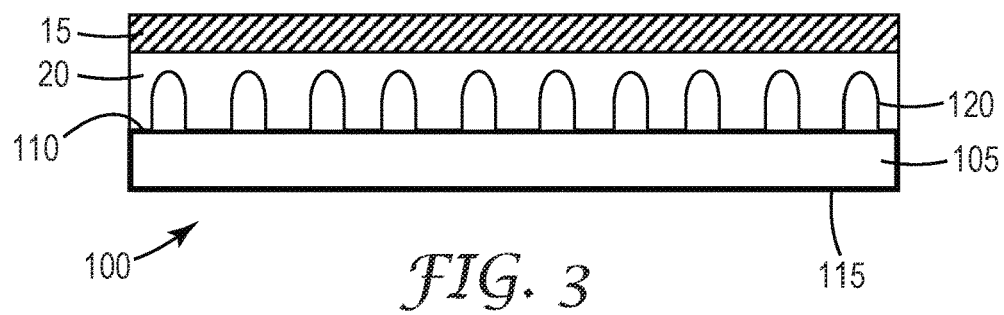
FIG. 3 illustrates a schematic cross section of a semiconductor substrate and a protective tape in accordance with some embodiments of the present disclosure.

In some embodiments, the present disclosure is further directed to articles formed upon coupling of the above discussed protective tapes to a substrate. In some embodiments, the substrate may be a semiconductor substrate. Referring now to FIG. 3, such an article 100 may include a semiconductor substrate 105 (e.g., silicon wafer or molding compound with embedded chip) coupled to the above-described protective tape 10. The semiconductor substrate 105 may include a circuit forming surface 110 and a non-circuit forming surface 115 opposite the circuit forming surface 110. The circuit forming surface 110 may bear thereon a plurality of surface features 120 that extend from the surface 110. The surface features 120 may include solder balls or copper pillar bumps. The above-discussed protective tape 10 may be coupled to the circuit forming surface 110 such that the adhesive layer 20 is disposed nearest the circuit forming surface 110. More specifically, in some embodiments, as shown in FIG. 3, the adhesive layer 20 may fully fill in the pitch between the bumps or copper pillars—the pitch distance can be as fine as 100 μm and wrap around the surface features 120 without air voids.

In this manner, the adhesive layer 20 may conform with the irregularities in the circuit forming surface 110 and prevent cracks and voids to support a stable backgrinding process. Furthermore, while the protective tape 10 remains coupled to the circuit forming surface 110, the whole article formed with the protective tape can perform one or more processing steps on the non-circuit forming surface 115 (e.g., backgrinding, metallization, or building a redistribution layer). After these high temperature processes, the adhesive can be cleanly removed from the surface 110 without adhesive residue.

Figure 4:
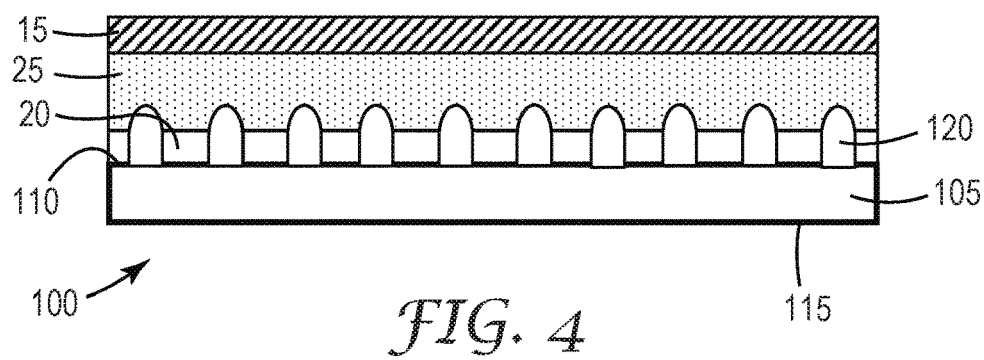
FIG. 4 illustrates a schematic cross section of a semiconductor substrate and a protective tape in accordance with some embodiments of the present disclosure.

Referring now to FIG. 4, in embodiments in which the optional intermediate layer 25 is present, as shown, the protective tape 10 may be borne on the circuit forming surface 110 such that both the adhesive layer 20 and the optional intermediate layer 25 contact the surface features 120 (and consequently, the thickness of the adhesive layer 20 may be less than the height of at least a portion the surface features 120)

In some embodiments, the present disclosure is directed to methods of using the protective tapes to temporarily protect one or more surfaces of a substrate (e.g. the circuit forming surface of a semiconductor wafer). The method may include coupling the protective tape 10 to the circuit forming surface 110 of the semiconductor substrate 105. In some embodiments, upon initial coupling, the adhesive layer 20 may be in an uncured state and the intermediate layer 25, if present, may be in the cured state. Despite the lower value of G' of the adhesive layer 20, it was found that the step of coupling may be carried out at a temperature that is 30-40° C. lower than the temperature at which the minimum value of G' of the adhesive layer 20 is exhibited. As previously discussed, it was discovered that curable adhesive layers of the present disclosure can fill in the fine pitch and wrap surface features of the circuit forming surface without air voids.

In some embodiments, the method may then include curing the adhesive layer 20. Curing may be carried out by subjecting the adhesive layer 20 to heat (e.g., at least 100° C. for at least 15 minutes).

In some embodiments, the method may then include performing one or more processing steps on the non-circuit forming surface 115 (e.g., backgrinding, metallization, or building a redistribution layer) while the protective tape 10 remains coupled to the circuit forming surface 110. This processing step may be carried out at a temperature that is greater than or equal to the temperature at which the adhesive layer 20 starts to cure. In some embodiments, during the processing step, the semiconductor wafer may be subjected to temperatures of at least 200° C., at least 250° C., at least 275° C., or at least 300° C.

Following the processing step, the method may include removing (e.g., by peeling) the protective tape 10 from the semiconductor substrate 105. As previously discussed, it was discovered that the cured adhesive layer of the present disclosure, even after very high temperature processing, can be removed from the circuit forming surface 105 without leaving a residue or leaving only a minimal amount of a residue.

EXAMPLES

Objects and advantages of this disclosure are further illustrated by the following comparative and illustrative examples.

Unless otherwise noted all parts, percentages, ratios, etc. in the Examples and the rest of the specification are by weight.

| Materials | |
|---|---|
| Abbreviation | Description and Source |
| G1730 | Styrene containing block copolymer, commercially available from Kraton Corporation as "KRATON G1730 M"' Houston, TX. |
| PP365 | Polypropylene homopolymer, commercially available from Total Petrochemicals & Refining USA, Inc. as "POLYPROPYLENE 3865"' Houston, TX. |
| Paralux 6001 | Colorless hydroprocessed processing oil, commercially available from Renkert Oil as "PARALUX PROCESS OIL 6001"' Morgantown, PA. |
| Escorez 1304 | A premium aliphatic hydrocarbon resins, commercially available from ExxonMobil as "ESCOREZ 5340"' ExxonMobil, USA. |
| Escorez 5340 | Cycloaliphatic hydrocarbon tackifying resin, commercially available from ExxonMobil as "ESCOREZ 5340", ExxonMobil USA. |
| Saret 519 | Trimethylolpropane Tri-acrylate - trifunctional acrylate ester crosslinker from Arkema Inc., King of Prussia, PA. |
| Kraton D1340 | Star Shaped SiS Block copolymer with 9% Styrene, commercially available from Kraton Corporation as "KRATON D1340", Houston, TX. |
| L750 | A hydrotreated naphthenic processing oil, available under the trade designation "HYPRENE L750" from Ergon Inc., Jackson, MS. |
| HRJ-10518 | A heat-reactive resin made from octylphenol and formaldehyde having reactive hydroxymethyl (methylol) functional groups, available under the trade designation "HRJ-10518", from SI Group, Schenectady, NY. |
| Pinerez 9089 | Zinc resinate of disproportioned resin with a high softening point that used as a tackifying resin and accelerator in rubber-based adhesives systems, available under the trade designation "PINEREZ 9089", from Lawter Inc., Chicago, IL. |
| Irganox 800 | Didodecyl-3,3'-thiodipropionate, an antioxidant available under the trade designation "IRGANOX 800", from BASF Corporation, Tarrytown, NY. |
| Nipol DN3335 | Acrylonitrile butadiene rubber, available under the trade designation "NIPOL DN3335", from Zeon Corporation, Louisville, KY. |
| Engage 8100 | Ethylene-octene polyolefin copolymer sold under the trade designation "ENGAGE 8100", from Dow Chemical CO., Midland, MI. |
| Topas 6017S | Cyclic olefin copolymer sold under the trade designation "TOPAS 6017s", from Topas Advance Polymers GmbH; Germany. |

-continued

| Materials | |
|---|---|
| Abbreviation | Description and Source |
| Irganox 1035 | Thiodiethylene bis[3-[3,5-di-tert-butyl-4-hydroxyphenyl]propionate, an antioxidant available under the trade designation "IRGANOX 1035", BASF Corporation, Tarrytown, NY. |
| Toluene | Toluene (Methyl Benzene), an aromatic hydrocarbon solvent. |
| Heptane | n-Heptane, a straight chain alkane solvent. |
| PI Film | A polyimide film (1 mil); available trade designation "KAPTON H100" from Dupont, Dupont America, Wilmington, DE. |
| Plain Wafer | 8 in (200 mm) diameter, pure silicon wafer; available from Purewafer, 700-750 micron thick, San Jose, CA. |
| Bumped Wafer | 8 in (200 mm) diameter wafer (PI + Cu Pilar Bumping); 700-750 micron thick, Cu pillar bump is 50 micron high, available from Chipbond Technology Corporation, Hsinchu, Taiwan. |
| SS Panel | 2 in (5.1 cm) × 3 in (7.6 cm) panels 18 gauge, 304 stainless steel with bright annealed finish; available from ChemInstrments, West Chester Township, OH. |

Test Methods

Stainless Steel 180° Peel Test Method

Peel samples were prepared by slitting uniform test strips at 0.5"×4" (12.7 mm×101.6 mm) from each tape and then laminating them along the length of a SS Panel by hand rolling each strip 4 times with a 2.0 kg rubber roller to obtain intimate contact between adhesive and adherent. SS Panels were cleaned with isopropanol/water 50:50 mixture prior to use. The peel adhesion strength was evaluated using an MTS Criterion Model 42 Tensile Tester, at a crosshead speed of 12 in/min (305 mm/min) and an angle of 180°. Samples were held in the bottom jar (clamp) with the tail extending upward toward the top jab. Peel testing results were reported as the average of three test specimens in units of newtons/centimeter (N/cm). Result are shown in Tables 3 and 6 (Curable Adhesive Layers) and Table 7 (Cured Intermediate Layer).

RT testing: Tape samples were laminated to SS Panels at ambient temperature (23° C.±2° C., 50% relative humidity±5%) condition. After 15 mins, 180° peel testing was conducted at the ambient temperature (23° C.±−2° C., 50% relative humidity±5%).

180° C. 1 hr testing: Tape samples were laminated to SS Panels at ambient temperature (23° C.±2° C., 50% relative humidity±5%). The laminate was placed on a plate and exposed to 180° C. temperature for 1 hr. After conditioning the samples for 1 hr at 180° C. and equilibrating at ambient temperature (23° C.±2° C., 50% relative humidity±5%) for at least 0.5 hr, 180° peel testing was conducted at the ambient temperature (23° C.±−2° C., 50% relative humidity±5%).

Plain Wafer 180° Peel Test Method

Peel samples were prepared by slitting uniform test strips at 0.5"×4" (12.7 mm×101.6 mm) from each tape and then laminating them on a Plain Wafer by hand rolling each strip 4 times with a 2.0 kg rubber roller to obtain intimate contact between adhesive and adherent. Each Plain Wafer was used once to avoid contamination. The peel adhesion strength was evaluated using an MTS Criterion Model 42 Tensile Tester, having a crosshead speed of 12 in/min (305 mm/min) and an angle of 180°. Samples were held in the bottom jar (clamp) with the tail extending upward toward the top jab. Peel testing results were reported as the average of three test specimen in units of N/cm. Result are shown in Table 3 (Curable Adhesive Layers).

RT testing: Tape samples were laminated to a Plain Wafer at ambient temperature (23° C.±2° C., 50% relative humidity±5%) condition. After 15 mins, 180° peel testing was conducted at the ambient temperature (23° C.±−2° C., 50% relative humidity±5%).

180° C. 1 hr testing: Tape samples were laminated to a Plain Wafer at ambient temperature (23° C.±2° C., 50% relative humidity±5%). Then laminate was place on a plate and exposed to 180° C. temperature for 1 hr. After conditioning samples for 1 hr at 180° C. and equilibrating at ambient temperature (23° C.±−2° C., 50% relative humidity±5%) for at least 0.5 hr, 180° peel testing was conducted at ambient temperature (23° C.±−2° C., 50% relative humidity±5%)

Bumped Wafer 180° Peel Test Method

A Bumped Wafer was preheated to 120° C. on a hot plate (such as a CEE APOGEE Model Bake Plate, available from Cost Effective Equipment, LLC, Rolla Missouri) for 15 mins. Adhesive strips, 0.5"×4" (12.7"×101.6"), where laminated onto the preheated Bumped Wafer by hand rolling each strip 4 times with a 2.0 kg rubber roller to obtain intimate contact between adhesive and adherent. The laminate was placed on a plate and exposed to 180° C. temperature for 1 hr. After conditioning samples for 1 hr at 180° C. and equilibrating at ambient temperature (23° C.±2° C., 50% relative humidity±5%) for at least 0.5 hr, then testing peel adhesions at the ambient temperature (23° C.±2° C., 50% relative humidity±5%), 180° peel testing was conducted. The peel adhesion strength was evaluated using an MTS Criterion Model 42 Tensile Tester, having a crosshead speed of 12" in/min (305 mm/min) and an angle of 180°. Samples were held in the bottom jar (clamp) with the tail extending upward toward the top jab. Peel testing results were reported as the average of three test specimens in units N/cm. Result are shown in Tables 3 and 6 (Curable Adhesive Layers).

Dynamic Mechanical Analysis Test Method

Physical properties of the curable adhesive layers and cured intermediate layers. as a function of temperature. were measured via dynamic mechanical analysis (DMA) using a parallel plate rheometer (obtained under the trade designation "AR2000" from TA Instruments, New Castle, Delaware). For each sample, an 8 mm diameter by 1 mm thick sample was cut out of a rectangular slab of the polymer layer and centered between 8 mm diameter parallel plates of the rheometer. The furnace doors that surround the parallel plates and shafts of the rheometer were shut, the temperature raised to 20° C., and then held for 5 minutes. The temperature was then ramped from 20° C. to 260° C. at 5° C./min., while the parallel plates were oscillated at a frequency of 1 Hz and a constant percent strain of 5%. Results at varying temperatures, including storage modulus (G') and tan delta, are shown in Table 2 and Table 5.

Preparatory Examples

Curable Adhesive Layers and Protective Tape Therefrom: Examples 1-5 (Ex 1-5) and Comparative Examples 6 and 7 (CE-6 and CE-7)

Curable adhesive layers were prepared by dissolving the components, per Table 1, into toluene or toluene/heptane 50/50 wt./wt. solvent in glass jars. Components were mixed in portions amounting to 30% solids composition by weight. Each resulting adhesive composition was then coated with slot die onto PI Film, yielding a 100 micron adhesive thickness (dry).

Cured Intermediate Layers, Examples 8-13, and Protective Tape Therefrom, Examples 14-19

Components used to form the cured intermediate layers, per Table 4, were mixed using a melt twin screw extruder. The temperature of the extruder was controlled at 350° F. (177° C.). The screw was run at 300 rpm. A gear pump was used to control the feed rate into the die. The rheological characteristics of the resulting compounds was controlled by adjusting the melt temperature of the extrudate. The die temperature was 350° F. (177° C.). The resulting melt stream was spread out in a cast film die and then quenched by a chill roll onto a PI film. The resulting extruded layer had a uniform thickness of about 12 mil (300 micron). The extruded layer was cured by passing through an electron beam at an electron intensity of 280KV 8Mrads and was then wound into the roll.

Following the procedure described above for the Curable Adhesive Layers, a curable adhesive layer was prepared based on the composition of Example 2 (see Table 1), with the following modifications: the composition was coated with slot die onto a 50 micron silicone coated release liner at a 50 micron adhesive layer thickness (dry). This Curable Adhesive Layer was laminated to the Cured Intermediate Layers, Table 4, followed by winding each tape into the roll.

TABLE 1

Curable Adhesive Layer Compositions (Values in wt. %).

| | Component | | | | | | |
|---|---|---|---|---|---|---|---|
| | Kraton D1340 | Escorez 1304 | L750 | HRJ-10518 | Pinerez 9089 | Irganox 800 | Irganox 1035 |
| Example 1 | 54.2 | 30.9 | — | 6.8 | 5.4 | 1.1 | 1.6 |
| Example 2 | 72.7 | 3.6 | 3.6 | 9.1 | 7.3 | 1.5 | 2.2 |
| Example 3 | 78.4 | 3.9 | 3.9 | 9.8 | — | 1.6 | 2.4 |
| Example 4 | 81.6 | 4.1 | 4.1 | 6.1 | — | 1.6 | 2.4 |
| Example 5 | 78.4 | 3.9 | 3.9 | 5.9 | 3.9 | 1.6 | 2.4 |
| CE-6 | 61.7 | 35.2 | — | — | — | 1.2 | 1.9 |
| CE-7 | 87.0 | 4.3 | 4.3 | — | — | 1.7 | 2.6 |

TABLE 2

Rheological Properties of the Curable Adhesive Layer.

| | Storage Modulus G' (MPa) | | | | | Tan Delta | | | | |
|---|---|---|---|---|---|---|---|---|---|---|
| Example | 25° C. | 50° C. | 100° C. | 200° C. | 250° C. | 25° C. | 50° C. | 100° C. | 200° C. | 250° C. |
| Ex. 1 | 0.141 | 0.112 | 0.047 | 0.207 | 0.231 | 0.29 | 0.38 | 0.43 | 0.02 | 0.06 |
| Ex. 2 | 0.223 | 0.165 | 0.086 | 0.375 | 0.378 | 0.15 | 0.24 | 0.34 | 0.009 | 0.004 |
| Ex. 3 | 0.277 | 0.197 | 0.107 | 0.34 | 0.525 | 0.15 | 0.23 | 0.32 | 0.03 | 0.004 |
| Ex. 4 | 0.277 | 0.206 | 0.129 | 0.277 | 0.428 | 0.15 | 0.22 | 0.32 | 0.067 | 0.012 |
| Ex. 5 | 0.251 | 0.187 | 0.103 | 0.321 | 0.316 | 0.14 | 0.23 | 0.32 | 0.024 | 0.013 |
| CE-6 | 0.169 | 0.129 | 0.058 | 0.014 | 0.004 | 0.13 | 0.23 | 0.4 | 1.02 | 1.37 |
| CE-7 | 0.285 | 0.205 | 0.125 | 0.039 | 0.024 | 0.14 | 0.22 | 0.31 | 0.71 | 0.87 |

TABLE 3

Peel Adhesion of Curable Adhesive Layers.

| | SS (N/cm) | | | | Plain Wafer (N/cm) | | | | Bumped Wafer (N/cm) | |
|---|---|---|---|---|---|---|---|---|---|---|
| Example | RT | Failure Mode | 180° C. 1 hr | Failure Mode | RT | Failure Mode | 180° C. 1 hr | Failure Mode | 180° C. 1 hr | Failure Mode |
| Ex. 1 | 4.79 | clean | 3.37 | clean | 7.63 | clean | 3.42 | clean | 3.61 | clean |
| Ex. 2 | 3.33 | clean | 0.36 | clean | 5.62 | clean | 0.66 | clean | 0.86 | clean |
| Ex. 3 | 3.41 | clean | 1.45 | clean | 3.72 | clean | 1.96 | clean | 1.24 | clean |
| Ex. 4 | 4.54 | clean | 2.17 | clean | 4.86 | clean | 3.79 | clean | 2.22 | clean |
| Ex. 5 | 3.23 | clean | 0.94 | clean | 4.93 | clean | 0.96 | clean | 0.94 | clean |
| CE-6 | 4.21 | clean | 10.86 | clean | 6.53 | clean | 8.54 | cohesive | 12.40 | cohesive |
| CE-7 | 0.49 | clean | 6.70 | clean | 1.07 | clean | 13.23 | ghost residue | 5.92 | cohesive |

TABLE 4

Intermediate Layer Compositions (Values in wt. %).

| Component | Example 8 | Example 9 | Example 10 | Example 11 | Example 12 | Example 13 |
|---|---|---|---|---|---|---|
| Kraton 1340 | — | 40 | — | — | 29 | — |
| Kraton G1730 | — | — | — | — | — | 54 |
| DN3335 | — | — | 40 | — | 29 | — |
| Engage 8100 | 52 | 12 | 12 | 42 | 19 | — |
| Escorez 53400 | 10 | 10 | 10 | 10 | 5 | 15 |
| Paralux Oil | 30 | 30 | 30 | 30 | 15 | 20 |
| TMPTA | 5 | 5 | 5 | 5 | — | 4 |
| TOPAX 6017S | — | — | — | 10 | — | — |
| PP3865 | — | — | — | — | — | 1 |
| Irgacure 651 | — | — | — | — | — | 2 |
| AO 1726 | — | — | — | — | — | 4 |
| Irganox PS 800 | 1 | 1 | 1 | 1 | 1 | — |
| Irganox 1035 | 2 | 2 | 2 | 2 | 2 | — |

TABLE 5

Rheological Properties of Cured Intermediate Layers

| | Storage Modulus G' (MPa) | | | | | Tan Delta | | | | |
|---|---|---|---|---|---|---|---|---|---|---|
| Example | 25° C. | 50° C. | 100° C. | 200° C. | 250° C. | 25° C. | 50° C. | 100° C. | 200° C. | 250° C. |
| Ex. 8 | 0.24 | 0.16 | 0.04 | 0.01 | 0.009 | 0.17 | 0.22 | 0.79 | 1.05 | 1.17 |
| Ex. 9 | 0.06 | 0.03 | 0.03 | 0.02 | 0.03 | 0.17 | 0.27 | 0.44 | 0.45 | 0.31 |
| Ex. 10 | 0.07 | 0.03 | 0.02 | 0.01 | 0.01 | 0.15 | 0.19 | 0.25 | 0.25 | 0.25 |
| Ex. 11 | 0.12 | 0.07 | 0.02 | 0.003 | 0.002 | 0.14 | 0.29 | 0.88 | 1.25 | 1.25 |
| Ex. 12 | 0.15 | 0.1 | 0.04 | 0.03 | 0.02 | 0.15 | 0.18 | 0.2 | 0.21 | 0.22 |
| Ex. 13 | 0.11 | 0.1 | 0.02 | 0.0007 | 0.0005 | 0.14 | 0.21 | 1.01 | 1.5 | 1.6 |

TABLE 6

Peel Adhesion of Curable Adhesive Layers.

| | Article Construction | | | | | | Bumped Wafer | |
|---|---|---|---|---|---|---|---|---|
| | | Cured | Curable | | SS (N/cm) | | (N/cm) | |
| | Support Layer | Intermediate Layer | Adhesive Layer | RT | 180° C. 1 hr | Failure Mode | 180° C. 1 hr | Failure Mode |
| Ex. 14 | PI Film | Example 8 | Ex. 2 | 4.9 | clean | 0.6 | clean | 0.7 | clean |
| Ex. 15 | PI Film | Example 9 | Ex. 2 | 2.8 | clean | 0.5 | clean | 0.6 | clean |
| Ex. 16 | PI Film | Example 10 | Ex. 2 | 2.5 | clean | 0.4 | clean | 0.3 | clean |
| Ex. 17 | PI Film | Example 11 | Ex. 2 | 2.8 | clean | 0.4 | clean | 0.5 | clean |
| Ex. 18 | PI Film | Example 12 | Ex. 2 | 5.2 | clean | 0.6 | clean | 0.7 | clean |
| Ex. 19 | PI Film | Example 13 | Ex. 2 | 3.1 | clean | 0.7 | clean | 0.7 | clean |

Various modifications and alterations to this disclosure will become apparent to those skilled in the art without departing from the scope and spirit of this disclosure. It should be understood that this disclosure is not intended to be unduly limited by the illustrative embodiments and examples set forth herein and that such examples and embodiments are presented by way of example only with the scope of the disclosure intended to be limited only by the claims set forth herein as follows. All references cited in this disclosure are herein incorporated by reference in their entirety.

What is claimed:

1. An article comprising:
    a substrate having a circuit forming surface and a non-circuit forming surface opposite the circuit forming surface; and
    a protective tape borne on the circuit forming surface, the protective tape comprising:
      a support layer; and
      a curable adhesive layer borne on a major surface of the support layer, the curable adhesive layer comprising a rubber elastomer and a thermal curing agent, and a cured intermediate layer that is disposed between the curable adhesive layer and the support layer, wherein the cured intermediate layer is the reaction product of a curable intermediate layer comprising an elastomer, a multifunctional crosslinker, and a process oil, and wherein the cured intermediate layer has an elastic storage modulus (G') that: (i) decreases with increasing temperature in the range of 25° C. to 250° C.; (ii) is between 0.0001 MPa and 0.7 MPa in the range of 25° C. to 250° C.; (iii) has a minimum value that occurs at 250° C.; and (iv) is greater than 0.0001 MPa at 250° C.; (v) at 250° C., is less than it is at 50° C.

2. The article of claim 1, wherein the curable adhesive layer has an elastic storage modulus (G') value of less than 0.1 MPa at 25° C. and 1 Hz.

3. The article of claim 1, wherein the curable adhesive layer has an elastic storage modulus (G') that: (i) is higher than 0.02 MPa in the range of 25° C. to 250° C.; (ii) is greater than 0.1 MPa at 250° C.; (iii) at 250° C., is greater than it is at 50° C.; (iv) exhibits a minimum value that occurs between 50° C. to 150° C. and is greater than 0.02 MPa.

4. The article of claim 1, wherein the curable adhesive layer has a tan delta at 200° C. of lower than 0.1.

5. The article of claim 1, wherein the rubber elastomer of the curable adhesive layer comprises natural rubber, synthetic thermoplastic elastomer, styrene-butadiene rubber, polybutadiene rubber, polyisoprene rubber, nitile rubber, ethylene-propylene rubber, ethylene-propylene diene monomer, ethylene-vinyl acetate, or acrylonitrile-butadiene-styrene rubber.

6. The article of claim 1, wherein the rubber elastomer is present in an amount of from 10 to 99 wt. %, based on the total weight of the curable adhesive layer.

7. The article of claim 1, wherein the thermal curing agent of the curable adhesive layer comprises a sulfur containing compound, a peroxide, a phenolic resins, or an aromatic guanidine.

8. The article of claim 1, wherein the thermal curing agent is present in an amount of from 1 to 50 wt. %, based on the total weight of the curable adhesive layer.

9. The article of claim 1, wherein the elastomer of the curable intermediate layer comprises natural rubber or synthetic thermoplastic elastomer, styrene-butadiene rubber, polybutadiene rubber, polyisoprene rubber, nitrile rubber, ethylene-propylene rubber (EPR), ethylene-propylene diene monomer (EPDM), ethylene-vinyl acetate (EVA), acrylonitrile-butadiene-styrene rubber, silicone rubber, polyolefin (co) polymer, thermoplastic polyurethane, acrylic elastomer, or engineered polyamide elastomer.

10. The article of claim 1, wherein the elastomer of the curable intermediate layer comprises saturated or unsaturated olefin blocks or polymers.

11. The article of claim 10, where the olefin blocks or polymers comprise oligomeric blocks of polyethylene, polypropylene, polyoctene, polyhexene, polybutadiene, polyisoprene, polybutene, or polypentene.

12. The article of claim 1, wherein the circuit forming surface comprises surface features.

13. The article of claim 12, wherein the surface features comprise copper pillar bumps or solder balls.

14. The article of claim 12, wherein the adhesive layer is borne on the support layer at a thickness that is greater than a maximum height of the surface features.

15. The article of claim 12, wherein, collectively, the curable adhesive layer and upon curing to form a cured adhesive layer, the cured adhesive layer, are borne on the support layer at a thickness that is greater than a maximum height of the surface features.

16. A method of processing a semiconductor wafer, the method comprising:
    providing the article of claim 1;
    curing the curable adhesive layer;
    performing one or more processes on the non-circuit forming surface; and
    separating the protective tape from the semiconductor wafer.

17. The method of claim 16, wherein performing one or more processes on the non-circuit forming surface comprises grinding the non-circuit forming surface.

18. The method of claim 16, wherein performing one or more processes on the non-circuit forming surface comprises subjecting the semiconductor wafer to a temperature of at least 180° C.

* * * * *